(12) United States Patent
Leppard

(10) Patent No.: US 8,296,274 B2
(45) Date of Patent: Oct. 23, 2012

(54) CONSIDERING MULTIPLE LOOKUPS IN BLOOM FILTER DECISION MAKING

(76) Inventor: Andrew Leppard, Unley (AU)

( * ) Notice: Subject to any disclaimer, the term of this patent is extended or adjusted under 35 U.S.C. 154(b) by 91 days.

(21) Appl. No.: 13/014,927

(22) Filed: Jan. 27, 2011

(65) Prior Publication Data

US 2012/0197851 A1   Aug. 2, 2012

(51) Int. Cl.
  *G06F 7/00* (2006.01)
  *G06F 17/00* (2006.01)
(52) U.S. Cl. .................. 707/692; 707/698; 707/749
(58) Field of Classification Search .................. 707/692
  See application file for complete search history.

(56) References Cited

U.S. PATENT DOCUMENTS

| | | |
|---|---|---|
| 5,990,810 A | 11/1999 | Williams |
| 2008/0133561 A1 | 6/2008 | Dubnicki |
| 2009/0268903 A1 | 10/2009 | Bojinov |

FOREIGN PATENT DOCUMENTS

WO   WO 2010/114856   10/2010

OTHER PUBLICATIONS

International Search Report and Written Opinion in Corresponding PCT matter PCT/US2012/022368.

*Primary Examiner* — Etienne LeRoux
*Assistant Examiner* — Mohammad Rahman

(57) ABSTRACT

Example apparatus, methods, and computers are configured to consider multiple lookups when making decisions concerning whether a probabilistic data structure indicates that an item is or is not present. One example method includes receiving a first response from a probabilistic data structure, where the first response indicates whether a first element is a member of a set of stored elements. The example method also includes receiving a set of second responses from the probabilistic data structure, where the set of second responses indicate whether members of a corresponding set of second elements are members of the set of stored elements. The method then provides a present/absent signal concerning whether the first element is a member of the set of stored elements. The signal is computed as a function of the first response and the set of second responses rather than merely as a function of the first response.

14 Claims, 5 Drawing Sheets

CONSIDERING MULTIPLE LOOKUPS IN BLOOM FILTER DECISION MAKING

BACKGROUND

A Bloom filter is a probabilistic data structure that is used to test whether a certain test element T is a member of a set S. Conventionally, lookups in Bloom filters have been treated as discrete events (e.g., dice rolls) as opposed to related events (e.g., cards pulled from a blackjack shoe). Probability and statistics make clear that a previous roll of a die has no effect on the likelihood of a certain result on a current or subsequent roll of a die. Probability and statistics also make clear that removing one card from a deck of cards does have an effect on the likelihood of a certain result when a subsequent card is pulled.

A Bloom filter may generate a false positive that incorrectly asserts that T is a member of S. However, a Bloom filter will not generate a false negative that incorrectly asserts that T is not a member of S. The ratio of false positives produced by a Bloom filter varies directly with the number of elements in S and varies inversely with the size of the Bloom filter. Therefore, a conventional approach to limit false positives has involved increasing the size of the Bloom filter and limiting the number of items for which entries are placed in the Bloom filter. Both of these approaches have significant drawbacks as the former increases the amount of memory required, and the latter decreases the usefulness of the filter.

A traditional Bloom filter uses 1.44 $\log_2(1/e)$ bits of space per inserted key, where e is the false positive rate. A hypothetically optimal probabilistic data structure would only require $\log_2(1/e)$ bits. Regardless of whether a hypothetical or traditional filter is used, the false positive rate varies directly with the number of entries in the filter.

Bloom filters have been employed in dedupe to facilitate quickly ascertaining whether a data sub-block currently being processed is already stored by a data deduplication (dedupe) application. Rather than doing an index lookup, which may involve disk access, a first step may be to consult a Bloom filter to determine whether to bother doing the index lookup. A Bloom filter can give a definite "no the entry is not in the index" but cannot give a definite "yes the entry is in the index" answer. If the data sub-block is definitely not stored, then the index will not be accessed. But if it is possible that the data sub-block is stored, then the index may be accessed. While a Bloom filter may be small enough to fit in memory, the index may be too large to fit in memory.

One of the goals of data deduplication (dedupe) is to reduce data storage. Dedupe applications typically store data sub-blocks in one location and store information (e.g., hash, key, location) about the stored data sub-blocks in another location (e.g., index). Rather than search through stored sub-blocks, a dedupe application may instead search an index. As deduped data sets become very large, an index used to locate and/or identify the presence of data sub-blocks may become too large to store in memory. Thus, at least a portion of a dedupe index may be stored on a secondary storage device (e.g., disk, tape). However, these secondary storage devices may be unacceptably slow for sub-block indexing. Therefore yet another layer of data structures may be added to a dedupe application. The additional data structures may include, for example, a Bloom filter. The Bloom filter may store information that identifies entries stored in the index. The Bloom filter would be small enough to reside in memory, rather than on a secondary storage device, and therefore doing an index lookup in a Bloom filter may be faster than doing a corresponding index lookup in an actual index.

BRIEF DESCRIPTION OF THE DRAWINGS

The accompanying drawings, which are incorporated in and constitute a part of the specification, illustrate various example methods, apparatuses, and other example embodiments of various aspects of the invention described herein. It will be appreciated that the illustrated element boundaries (e.g., boxes, groups of boxes, other shapes) in the figures represent one example of the boundaries of the elements. One of ordinary skill in the art will appreciate that in some examples one element may be designed as multiple elements or that multiple elements may be designed as one element. In some examples, an element shown as an internal component of another element may be implemented as an external component and vice versa. Furthermore, elements may not be drawn to scale.

DETAILED DESCRIPTION

Figure 1:
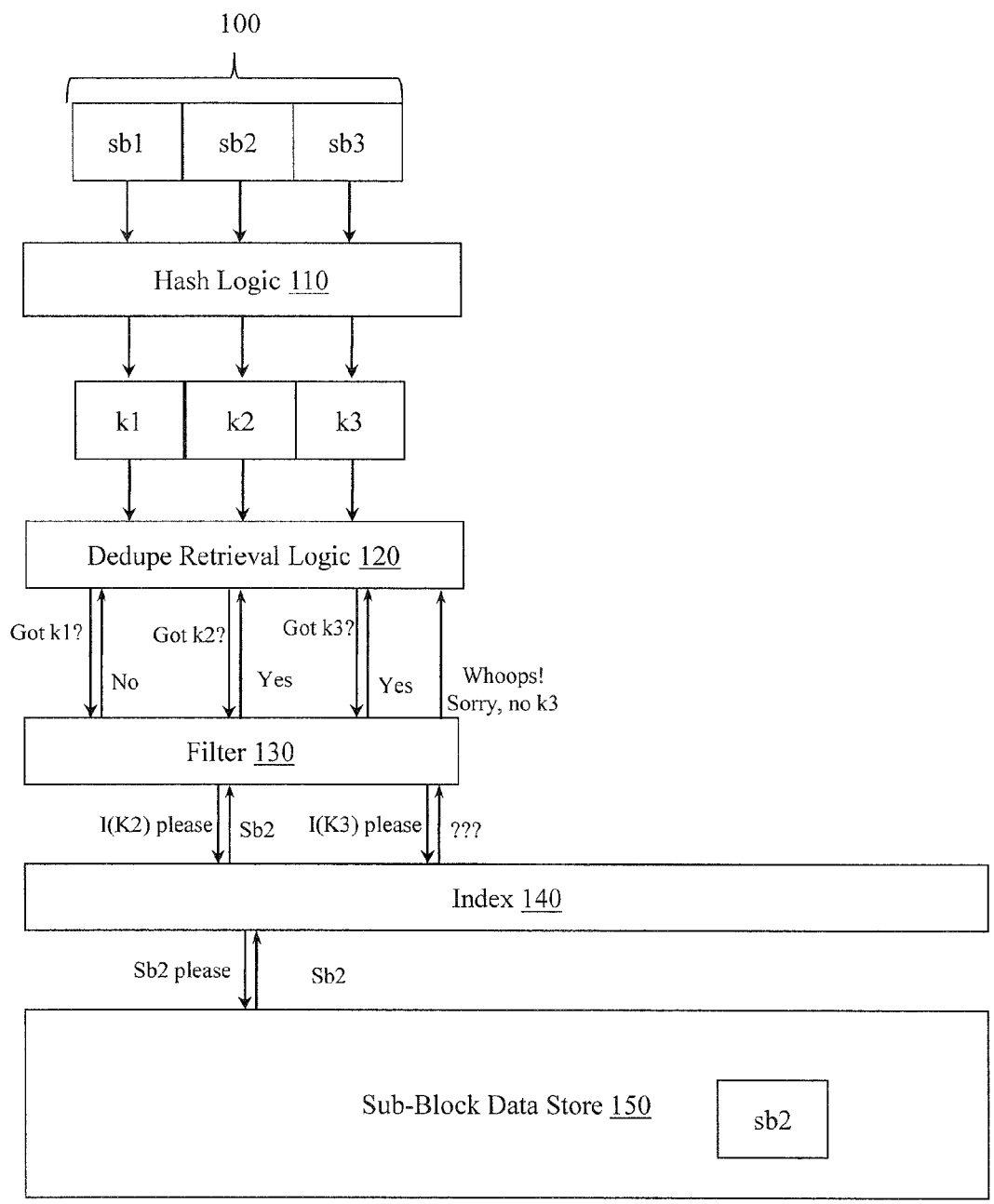
FIG. 1 illustrates a dedupe environment where a false negative has occurred.

Example systems and methods may consider the result of Bloom filter lookups for related (e.g., neighboring) sub-blocks when determining whether a sub-block has an associated entry in a dedupe index. Conventionally, Bloom filter lookups have been treated as individual, unrelated events based, at least in part, on the assumption that members of the set whose membership is represented in the Bloom filter are independent and/or random. However, in the dedupe environment, the way in which data sub-blocks are processed and stored is neither independent nor random. A larger block of data may be split into sub-blocks of data. The sub-blocks may then be processed in a similar way at a similar time and may be stored in related locations. Sub-blocks may be intentionally stored to facilitate being read and/or written as larger related blocks. Therefore, in the dedupe environment, the set whose membership is represented by the Bloom filter includes related items, not just random independent items.

Observation of Bloom filters in the dedupe environment indicates that true positives may occur in series or patterns. This is anticipated because sub-blocks are portions of larger data blocks and finding one part of a larger data block generally means that another part of that larger data block should be expected. Additionally, observation of Bloom filters in the dedupe environment indicates that an isolated positive observed in a collection of true negatives may likely be a false positive. This is also anticipated because if a large data block has been sub-divided and few, if any, of the members of the large data block have been found in a dedupe repository then it is unlikely that other members of the large data block will also be found. However, a long run of true negatives may quickly transition into a long run of true positives when a dedupe application finishes processing one item (e.g., file) whose sub-blocks were not stored and begins processing another item (e.g., file) that had previously been encountered by the dedupe application.

Based on an understanding of the dedupe environment, Bloom filter lookups in the dedupe environment may be treated as related events. The relationship between events flows from how blocks are parsed into sub-blocks and how the sub-blocks are processed and stored. Therefore, example systems and methods may consider the result of Bloom filter lookups for related (e.g., neighboring) sub-blocks when determining whether a sub-block has an associated entry in a dedupe index. For example, if previous and/or subsequent lookups are negative, then an individual lookup that is positive may be switched to a negative. Since a Bloom filter cannot produce a false negative, the counter case where previous and/or subsequent lookups are positive will not be used to switch a negative to a positive. While reducing false positives, this approach may introduce false negatives. However, in dedupe, a small number of false negatives is more acceptable than a larger number of false positives. A false negative means an isolated sub-block is not matched when it could have been, which can cause the sub-block to be stored again. A false positive leads to an unnecessary input/output read.

In one embodiment, patterns of Bloom filter lookups may also be acquired and stored. The patterns may be related to multiple lookups associated with multiple entities. For a static or nearly static set of stored sub-blocks, these patterns may be useful for more quickly determining matches.

FIG. 1 illustrates a dedupe environment where a false positive has occurred. A data block 100 is illustrated having been partitioned into three sub-blocks (e.g., sb1, sb2, sb3). A hash logic 110 has computed three keys (e.g., k1, k2, k3) corresponding to the three sub-blocks. A dedupe retrieval logic 120 has done a lookup in a filter 130 for each of the three keys. The filter 130 correctly responded that there was no entry for k1 in index 140. The filter 130 also correctly responded that there was an entry for k2 in index 140. Thus index 140 was consulted to facilitate locating sb2 in data store 150. The filter 130 incorrectly responded that there was an entry in index 140 for k3. However, there was no entry for k3 in index 140 and thus an expensive secondary data storage access was incurred. Example systems and methods seek to reduce the number of false positives like that associated with k3 by considering Bloom filter lookups to be related events.

Figure 2:
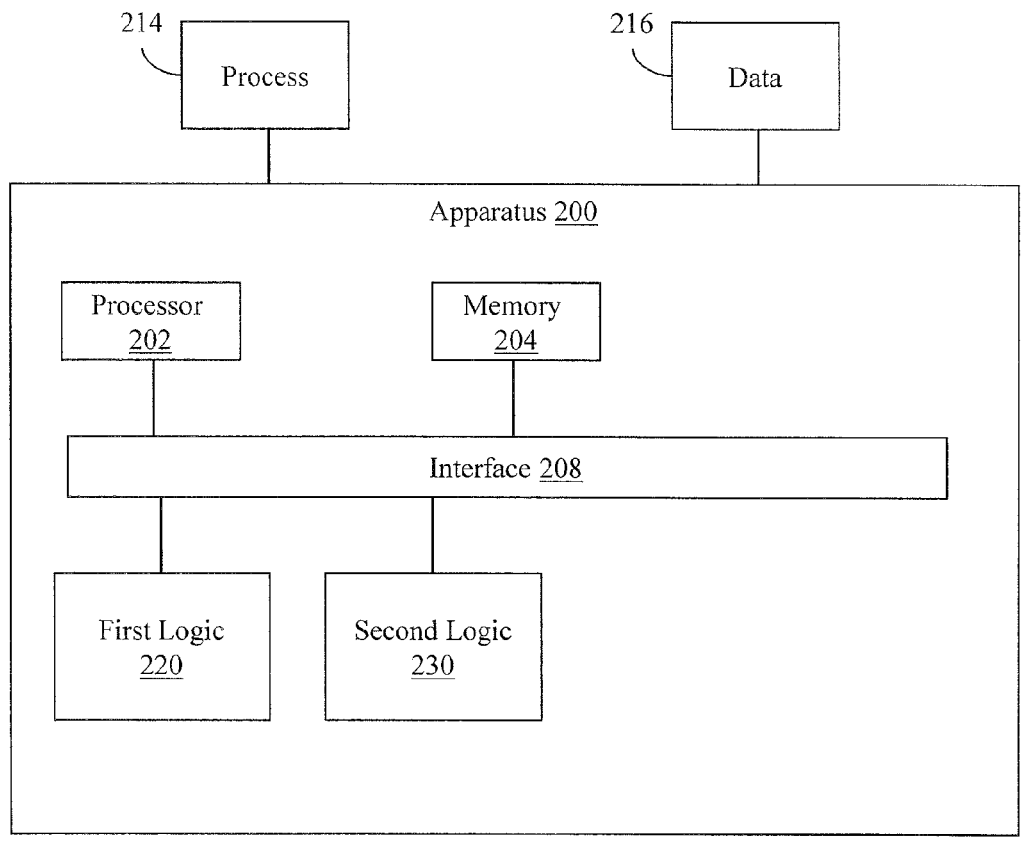
FIG. 2 illustrates an apparatus configured to consider multiple lookups in bloom filter decision making.

FIG. 2 illustrates an apparatus 200. Apparatus 200 is configured to consider multiple lookups in bloom filter decision making. Apparatus 200 may be, for example, a computer that includes a processor 202 and a memory 204 that are operably connected by an interface 208. In one example, the computer 200 may include a first logic 220 and a second logic 230.

The first logic 220 may be configured to provide a value associated with the probability that an element is a member of a set of elements. In the dedupe environment, the element will be a data sub-block being processed by a data de-duplication logic. The de-duplication logic may wish to determine whether it is necessary to store the data sub-block or whether the data sub-block is already stored. The set of elements will be a set of data sub-blocks previously stored by the data de-duplication logic. The first logic 220 will provide the value in response to a lookup of a key value in a probabilistic data structure that stores information concerning members of the set of elements. In the dedupe environment, the key value will be associated with the data sub-block. The key value may be, for example, a hash of the data sub-block. The probabilistic data structure may be, for example, a Bloom filter. In one embodiment, the Bloom filter will be sized and configured to be stored in memory 204.

The second logic 230 is configured to provide a present/absent signal indicating whether a data sub-block is present or absent in the set of elements. Recall that conventional systems that would generate the present/absent signal based on a single lookup in the Bloom filter for the data sub-block being processed. Unlike conventional systems, the present/absent signal is computed as a function of two or more values provided by the first logic 220. The two or more values include one value directly related to the data sub-block and at least one value indirectly related to the data sub-block. Being directly related to the data sub-block means that the value is provided in response to doing a lookup for the key for the data sub-block. Being indirectly related to the data sub-block means that the value is provided in response to a lookup performed within a threshold time either before or after the lookup for the data sub-block. The threshold time may be measured, for example, in a number of lookups, by time, and by other measuring metrics.

The function used by the second logic 230 may take different forms. In one embodiment, the function takes the form:

$$F(sb)=F(\text{lookup}(sb),\text{lookup}(sb-),\text{lookup}(sb+)).$$

sb is the sub-block for which a present/absent signal is to be provided by apparatus 200. sb− is zero or more sub-blocks processed by the data de-duplication logic before processing sb, and sb+ is zero or more sub-blocks processed by the data de-duplication logic after processing sb. In different examples sb− and sb+ can have different numbers of members. For example, when a new data block is encountered, sub-blocks processed after an initial sub-block may be more relevant than sub-blocks processed before the initial sub-block since those sub-blocks would likely have been associated with a different data block. F(sb) is a function whose value is suitable for making a present/absent decision. For example, if the value is positive then the signal for sub-block sb may indicate that sb is present while if the value is negative then the signal may indicate that sb is not present. Lookup(sb) is function whose value indicates whether a key value associated with sb is found in the Bloom filter.

F(sb) is configured to make it possible to turn a present indication from lookup(sb) into an absent indication. Thus, f(sb) can yield a result indicating that sb is not present in the set of elements when a result from lookup(sb) indicates that sb is present in the set of elements. However, F(sb) cannot yield a result indicating that sb is present in the set of elements when a result from lookup(sb) indicates that sb is not present in the set of elements.

In another embodiment, the function takes the form:

$$F(sb) = \text{lookup}(sb) + \sum_{i=1}^{After} (\text{lookup}(sb+i)*wa_i) + \sum_{j=1}^{Before} (\text{lookup}(sb-j)*wb_j)$$

sb is the sub-block for which a present/absent signal is to be provided by apparatus 200. sb+i are sub-blocks processed after sb and sb−j are sub-blocks processed after sb. After is the number of lookups after lookup(sb) to be considered, and Before is the number of lookups before lookup(sb) to be considered. In different examples Before and After may be different and may be configurable. Additionally, Before and After may be adaptable during processing. For example, after a period of inactivity, Before may be set to a small number (e.g., 0) while After is set to a larger number (e.g., 25). However, as continuous processing occurs, Before and After may converge towards a common value (e.g., 10). Then, as processing continues even further, Before may be set to a larger number (e.g., 25) while After may be shrunk in anticipation of reaching the end of a long run. In another example, Before and After may be configured based, for example, on data entropy, on a false positive rate, and on other factors.

$wa_i$ is a weight for a lookup after lookup(sb) and $wb_j$ is a weight for a lookup before lookup(sb). The weights may vary according to different distributions including, for example, a linear distribution, and a Gaussian distribution. Thus, lookups made closer to the lookup of sb may be more relevant than lookups made farther from the lookup of sb. The weights may also be configurable based on factors including sub-block size, entropy, false positive rate, and so on.

The function is designed to produce fewer false positives than would be produced if only one value (e.g., the lookup for the data sub-block itself) provided by the first logic 220 was considered.

Recall that one of the goals of dedupe is to reduce memory storage. Therefore, in different embodiments, the probabilistic data structure may be constrained to use less than 1.44 log 2(1/e) bits of space per key stored in the probabilistic data structure, e being the false positive rate for the probabilistic data structure.

Generally describing an example configuration of the computer 200, the processor 202 may be a variety of various processors including dual microprocessor and other multi-processor architectures. A memory 204 may include volatile memory (e.g., RAM (random access memory)) and/or non-volatile memory (e.g., ROM (read only memory)). The memory 204 can store a process 214 and/or a data 216, for example. The process 214 may be a data reduction process and the data 216 may be an object to be data reduced.

The bus 208 may be a single internal bus interconnect architecture and/or other bus or mesh architectures. While a single bus is illustrated, it is to be appreciated that the computer 200 may communicate with various devices, logics, and peripherals using other busses (e.g., PCIE (peripheral component interconnect express), 1394, USB (universal serial bus), Ethernet). The bus 208 can be types including, for example, a memory bus, a memory controller, a peripheral bus, an external bus, a crossbar switch, and/or a local bus. One skilled in the art will appreciate that in one embodiment the first logic 220 and the second logic 230 may be combined into one logic or may be distributed into more than two logics.

Figure 3:
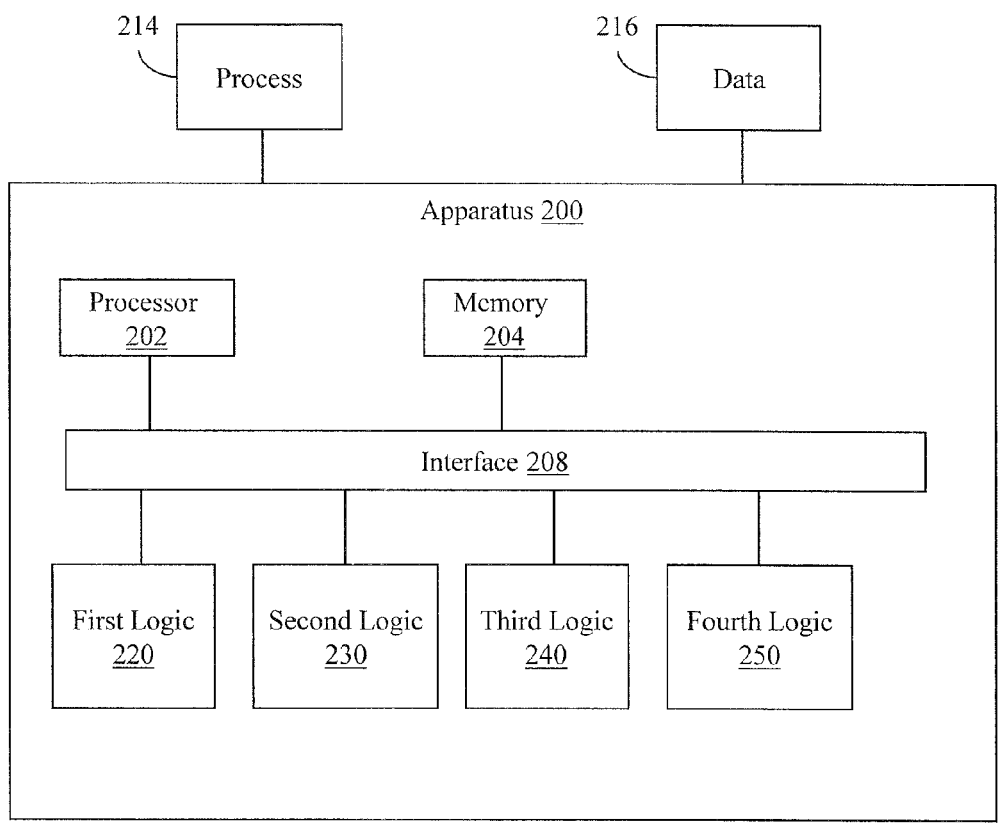
FIG. 3 illustrates an embodiment of an apparatus configured to consider multiple lookups in bloom filter decision making.

FIG. 3 illustrates another embodiment of apparatus 200. This embodiment includes a third logic 240 that is configured to store patterns produced by multiple logics and a fourth logic 250 that is configured to make a present/absent determination for a sub-block based, at least in part, on the stored pattern. In one example, third logic 240 and fourth logic 250 will only be employed upon determining that the set of elements has remained static or has remained static to within a threshold. Thus, third logic 240 and fourth logic 250 may be used for a data set that is not changing very much, if at all. This type of data set may be present when dedupe chunking and hashing is being used for security purposes. For example, before accepting a block of data, a computer may chunk and hash the data and check the hashes of the sub-blocks. In one embodiment, hashes may be checked to see whether the hash identifies a known virus while in another embodiment hashes may be checked to insure that a sub-block has been safely processed before. One skilled in the art will appreciate that in one embodiment the first logic 220, the second logic 230, the third logic 240, and the fourth logic 250 may be combined into one logic or may be distributed into more than four logics.

Figure 4:
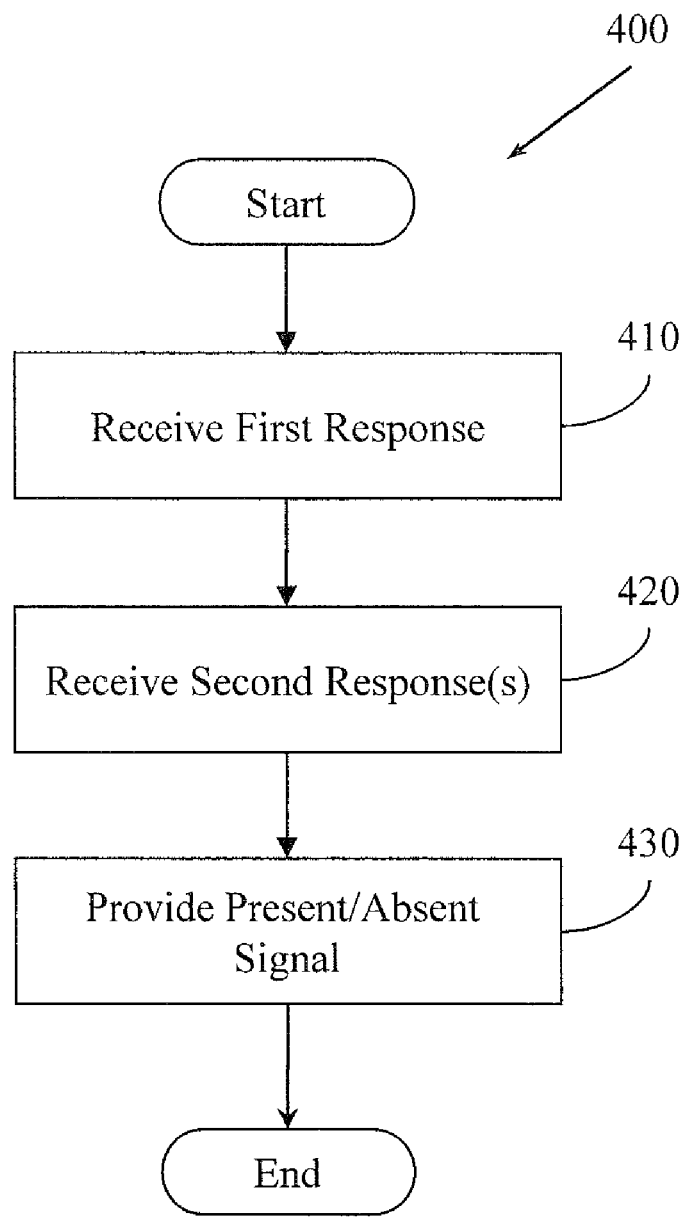
FIG. 4 illustrates a flowchart of a method configured to consider multiple lookups in bloom filter decision making.

FIG. 4 illustrates a flowchart of a method 400 that considers multiple lookups in bloom filter decision making. In one example, a non-transitory computer-readable medium may store computer executable instructions that when processed by a computer control the computer to perform method 400.

Method 400 includes, at 410, receiving a first response from a probabilistic data structure (e.g., Bloom filter). The first response indicates whether a first element (e.g., data sub-block) is a member of a set of stored elements (e.g., stored sub-blocks). The first response may be the result of a key value (e.g., dedupe hash) lookup in a Bloom filter.

Method 400 also includes, at 420, receiving a set of second responses from the probabilistic data structure. The set of second responses indicate whether members of a corresponding set of second elements (e.g., data sub-blocks) are members of the set of stored elements. The set of second elements can include elements looked up before the first element and/or elements looked up after the first element. The set of second responses may include zero or more lookups before the first element and zero or more lookups after the first element.

Method 400 also includes, at 430, providing a presence/absence signal concerning whether the first element is a member of the set of stored elements. The signal is computed as a function of the first response and the set of second responses. Thus, rather than make a Bloom filter positive decision based solely on the lookup of the test element, neighboring lookups may also be considered. While neighboring lookups cannot turn a negative into a positive, the neighboring lookups can be used to turn a positive into a negative.

In one embodiment, lookups that are performed just before and/or just after the lookup for the first element may be given more significance than lookups that are performed further from the lookup for the first element. In one example, the significance of a member of the set of second elements in computing the presence/absence signal varies directly with the number of sub-blocks processed in between when the member of the second set of elements was processed and when the first element was processed. The variance may be, for example, linear, Gaussian, and so on.

In one example, the method includes selectively determining that the first element is not a member of the set of stored elements even though the first response indicates that the first element is a member of the set of elements. The selective determination is made upon determining that more than a threshold number of the set of second responses are negative responses.

Figure 5:
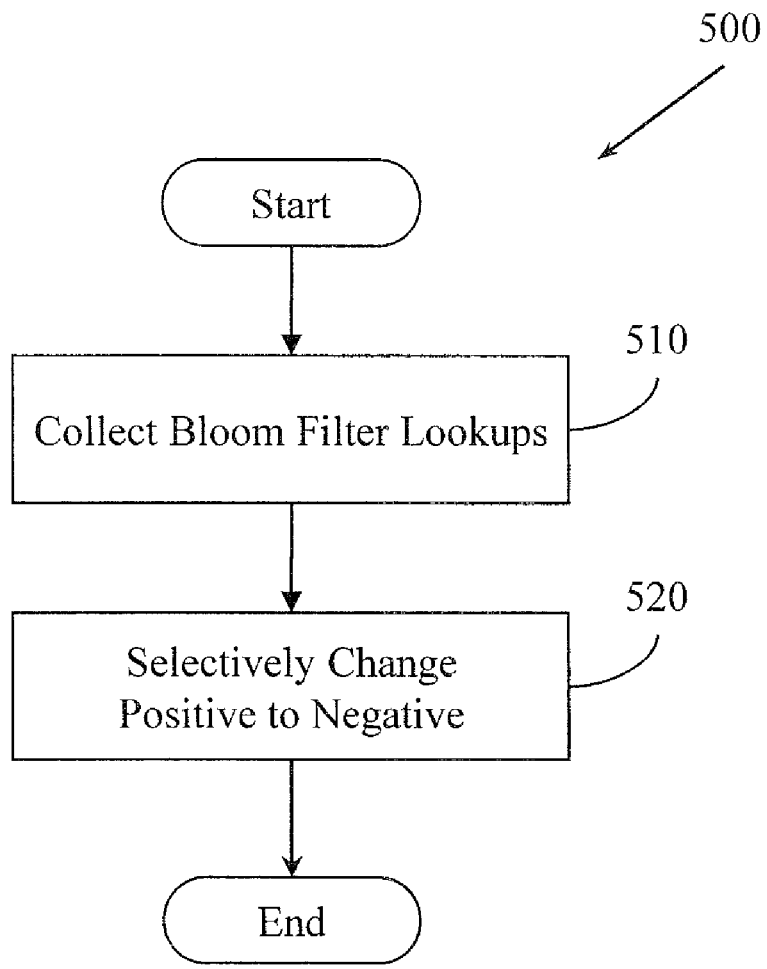
FIG. 5 illustrates a flowchart of a method configured to consider multiple lookups in bloom filter decision making.

FIG. 5 illustrates a flowchart of a method 500 that is configured to consider multiple lookups in bloom filter decision making. Method 500 includes, at 510, collecting Bloom filter lookups. Method 500 also includes, at 520, selectively changing a positive result to a negative result as a result of neighboring negative result(s).

Thus method 500 more generally is configured to make a set membership determination for a test element based on a result from a Bloom filter lookup for the test element and a collection of Bloom filter lookups performed before the Bloom filter lookup for the test element, performed after the Bloom filter lookup for the test element, or performed both before and after the Bloom filter lookup for the test element. The set membership determination may include selectively changing what would otherwise be a positive set membership determination into a negative set membership determination as a function of detecting more than a threshold number of negative results in the collection of related results from a Bloom filter lookup.

The following includes definitions of selected terms employed herein. The definitions include various examples and/or forms of components that fall within the scope of a term and that may be used for implementation. The examples are not intended to be limiting.

References to "one embodiment", "an embodiment", "one example", "an example", and other similar terms indicate that the embodiment(s) or example(s) so described may include a particular feature, structure, characteristic, property, element, or limitation, but that not every embodiment or example necessarily includes that particular feature, structure, characteristic, property, element or limitation. Furthermore, repeated use of the phrase "in one embodiment" or "in one example" does not necessarily refer to the same embodiment or example.

"Logic", as used herein, includes but is not limited to hardware, firmware, software in execution on a machine, and/or combinations of each to perform a function(s) or an action(s), and/or to cause a function or action from another logic, method, and/or system. Logic may include a software controlled microprocessor, a discrete logic (e.g., ASIC), an analog circuit, a digital circuit, a programmed logic device, a memory device containing instructions, and so on. Logic may include one or more gates, combinations of gates, or other circuit components. Where multiple logical logics are described, it may be possible to incorporate the multiple logical logics into one physical logic. Similarly, where a single logical logic is described, it may be possible to distribute that single logical logic between multiple physical logics.

Some portions of the detailed descriptions that follow are presented in terms of algorithms and symbolic representations of operations on data bits within a memory. These algorithmic descriptions and representations are used by those skilled in the art to convey the substance of their work to others. An algorithm, here and generally, is conceived to be a sequence of operations that produce a result. The operations include physical manipulations of physical quantities. Usually, though not necessarily, the physical quantities take the form of electrical or magnetic signals capable of being stored, transferred, combined, compared, and otherwise manipulated in a logic. The physical manipulations transform electronic components and/or data representing physical entities from one state to another.

Example methods may be better appreciated with reference to flow diagrams. While for purposes of simplicity of explanation, the illustrated methodologies are shown and described as a series of blocks, it is to be appreciated that the methodologies are not limited by the order of the blocks, as some blocks can occur in different orders and/or concurrently with other blocks from that shown and described. Moreover, less than all the illustrated blocks may be used to implement an example methodology. Blocks may be combined or separated into multiple components. Furthermore, additional and/or alternative methodologies can employ additional, not illustrated blocks.

"Computer readable medium", as used herein, refers to a non-transitory medium that stores signals, instructions and/or data. A computer readable medium may take forms, including, but not limited to, non-volatile media, and volatile media. Non-volatile media may include, for example, optical disks, and magnetic disks. Volatile media may include, for example, semiconductor memories, and dynamic memory. Common forms of a computer readable medium may include, but are not limited to, a floppy disk, a flexible disk, a hard disk, a magnetic tape, other magnetic medium, an ASIC, a CD (compact disk), other optical medium, a RAM (random access memory), a ROM (read only memory), a memory chip or card, a memory stick, and other media from which a computer, a processor, or other electronic device can read.

While example apparatus, methods, and articles of manufacture have been illustrated by describing examples, and while the examples have been described in considerable detail, it is not the intention of the applicants to restrict or in any way limit the scope of the appended claims to such detail. It is, of course, not possible to describe every conceivable combination of components or methodologies for purposes of describing the systems, methods, and so on described herein. Therefore, the invention is not limited to the specific details, the representative apparatus, and illustrative examples shown and described. Thus, this application is intended to embrace alterations, modifications, and variations that fall within the scope of the appended claims.

To the extent that the term "includes" or "including" is employed in the detailed description or the claims, it is intended to be inclusive in a manner similar to, the term "comprising" as that term is interpreted when employed as a transitional word in a claim.

To the extent that the term "or" is employed in the detailed description or claims (e.g., A or B) it is intended to mean "A or B or both". When the applicants intend to indicate "only A or B but not both" then the term "only A or B but not both" will be employed. Thus, use of the term "or" herein is the inclusive, and not the exclusive use. See, Bryan A. Garner, A Dictionary of Modern Legal Usage 624 (2d. Ed. 1995).

What is claimed is:

1. An apparatus, comprising:
a processor;
a memory;
a set of logics comprising a first logic and a second logic; and
an interface to connect the processor, the memory, and the set of logics,
the first logic being configured to provide a value associated with the probability that a data sub-block processed by a data de-duplication logic is a member of a set of data sub-blocks stored by the data de-duplication logic, the value being provided in response to a lookup of a key value in a probabilistic data structure that stores information concerning members of the set of data sub-blocks, the key value being associated with a data sub-block, the key value being a de-duplication hash of the element, the probabilistic data structure being a Bloom filter, the Bloom filter being stored in the memory; and
the second logic being configured to provide a present/absent signal indicating whether a data sub-block is present or absent in the set of data sub-blocks, where the present/absent signal is computed as a function of two or more values provided by the first logic, where one of the two or more values is directly related to the data sub-block and at least one of the two or more values are indirectly related to the data sub-block.

2. The apparatus of claim 1, where the function of two or more values is of the form:

$$F(sb)=F(\text{lookup}(sb), \text{lookup}(sb-), \text{lookup}(sb+))$$

where:
F(sb) is a function upon whose value a present/absent decision can be made,
lookup(x) is function whose value indicates whether the key value x is found in the Bloom filter,
sb is the sub-block for which the present/absent signal is to be provided,
sb− is zero or more sub-blocks processed by the data de-duplication logic before processing sb, and
sb+ is zero or more sub-blocks processed by the data de-duplication logic after processing sb.

3. The apparatus of claim 2, where F(sb) can yield a result indicating that sb is not present in the set of elements when a result from lookup(sb) indicates that sb is present in the set of elements.

4. The apparatus of claim 3, where F(sb) cannot yield a result indicating that sb is present in the set of elements when a result from lookup(sb) indicates that sb is not present in the set of elements.

5. The apparatus of claim 1, where the function is of the form:

$$F(sb) = \text{lookup}(sb) + \sum_{i=1}^{After} (\text{lookup}(sb_i) * wa_i) + \sum_{j=1}^{Before} (\text{lookup}(sb_i) * wb_j)$$

where:
F(sb) is a function upon whose value a present/absent decision can be made,
lookup(x) is function whose value indicates whether the key value x is found in the probabilistic data structure,
After is the number of lookups after lookup(sb) to be considered,
Before is the number of lookups before lookup(sb) to be considered,
$wa_i$ is a weight for a lookup after lookup(sb), and
$wb_j$ is a weight for a lookup before lookup(sb).

6. The apparatus of claim 5, where one or more of, After, Before, $wa_i$ and $wb_j$ are dynamically configurable based, at least in part, on one or more of, sub-block size, a false positive rate, and data entropy.

7. The apparatus of claim 1, where the function is configured to produce fewer false positives than would be produced if only one value provided by the first logic was considered.

8. The apparatus of claim 1, the set of logics comprising:
a third logic configured to store patterns produced by multiple logics; and
a fourth logic configured to make a present/absent determination for a sub-block based, at least in part, on the stored pattern.

9. The apparatus of claim 1, where the probabilistic data structure uses less than 1.44 log 2(1/e) bits of space per key stored in the probabilistic data structure, e being the false positive rate for the probabilistic data structure.

10. A non-transitory computer-readable medium storing computer executable instructions that when processed by a computer control the computer to perform a data de-duplication method, the method comprising:
receiving a first response from a probabilistic data structure, where the first response indicates whether a first element is a member of a set of stored elements;
receiving a set of second responses from the probabilistic data structure, where the set of second responses indicate whether members of a corresponding set of second elements are members of the set of stored elements; and
providing a present/absent signal concerning whether the first element is a member of the set of stored elements, where the signal is computed as a function of the first response and the set of second responses, the probabilistic data structure being a Bloom filter.

11. The non-transitory computer-readable medium of claim 10, where the first element is a data sub-block being processed by a data de-duplication logic, where members of the set of stored elements are data sub-blocks stored by the data de-duplication logic, and where members of the set of second elements are data sub-blocks processed by the data de-duplication logic.

12. The non-transitory computer-readable medium of claim 11, where the set of second elements includes one or more of, data sub-blocks processed before the first element, and data sub-blocks processed after the first element.

13. The non-transitory computer-readable medium of claim 12, where the significance of a member of the set of second elements to the present/absent signal varies directly with the number of sub-blocks processed in between when the member of the second set of elements was processed and when the first element was processed.

14. The non-transitory computer-readable medium of claim 10, comprising selectively determining that the first element is not a member of the set of stored elements even though the first response indicates that the first element is a member of the set of elements upon determining that more than a threshold number of the set of second responses are negative responses.

* * * * *